United States Patent [19]

LeGrand

[11] 4,290,028

[45] Sep. 15, 1981

[54] HIGH SPEED PHASE LOCKED LOOP FREQUENCY SYNTHESIZER

[75] Inventor: Jesse S. LeGrand, Clifton, N.J.

[73] Assignee: International Telephone and Telegraph Corporation, New York, N.Y.

[21] Appl. No.: 61,723

[22] Filed: Jul. 30, 1979

[51] Int. Cl.[3] .............................................. H03L 7/18

[52] U.S. Cl. ...................................... 331/1 A; 331/16; 331/17; 331/25

[58] Field of Search ..................... 331/1 A, 16, 17, 18, 331/25

[56] References Cited

U.S. PATENT DOCUMENTS

| | | | |
|---|---|---|---|
| 3,516,007 | 6/1970 | Bos et al. | 331/18 |
| 3,872,397 | 3/1975 | Hanneman | 331/25 X |
| 3,898,690 | 8/1975 | Desai | 331/17 X |
| 3,959,737 | 5/1976 | Tanis | 331/1 A |
| 4,121,162 | 10/1978 | Alberkrack et al. | 331/1 A X |

*Primary Examiner*—Siegfried H. Grimm

*Attorney, Agent, or Firm*—John T. O'Halloran; Alfred C. Hill

[57] ABSTRACT

A phase locked looped type frequency synthesizer utilizing a source of a reference signal comprising a voltage controlled oscillator and a phase detector which receives the reference signal and compares that to the output signal of the voltage control oscillator after suitable division by a programmable divider. The phase detector outputs a control voltage to the oscillator thereby regulating the output frequency from the oscillator wherein the programmable divider is programmed to divide or count by N, where N is capable of being a division number which is an integer or non-integer thereby allowing an increasing of the reference frequency and a decreasing of the settling time of the system without a need to increase the channel spacing.

19 Claims, 8 Drawing Figures

HIGH SPEED PHASE LOCKED LOOP FREQUENCY SYNTHESIZER

FIELD OF THE INVENTION

The invention relates to improvements in high speed frequency synthesizers and more particularly to frequency synthesizers of the phase lock loop type.

BACKGROUND OF THE INVENTION

In a conventional Type II phase lock loop frequency synthesizer, as shown in FIG. 1, the output frequency (fo) is equal to N times the reference frequency (fr). If we assume the loop is locked and stabilized when a frequency step (Δf) is introduced into the voltage controlled oscillator (VCO) the VCO will return to the correct frequency without cycle slipping. This is provided it is not exceedingly great. This frequency error—time relationship depends on the loop band-width and the damping factor.

In normal structures, if the feedback loop is open, and the VCO frequency is within the bounds of fo+Δf, the VCO will be pulled to fo without cycle slipping, as long as the proper initial conditions exist.

Often, it is desired to change the output frequency providing for frequency hopping. In this system, the division number N is changed, causing the VCO to hop frequency. In some systems the time between the time N is changed and the time (settling time) the frequency settles to within some specified error (fe) is important. Often it is desired and preferable that the settling time be as short as possible.

In an optimized loop the settling time is approximately inversely proportional to the reference frequency, (fr). The greater the reference frequency the less settling time necessary. Incrementing or decrementing N changes the output frequency fo by fr. Thus, the settling time would be inversely proportional to the channel spacing. The present systems are, however, handicapped to a certain extent, since it is the usual nature of the frequency divider that N must be an integer.

SUMMARY OF THE INVENTION

The present invention contemplates providing for a change of a conventional phase lock loop frequency synthesizer, as shown in FIG. 1, so that the average value of the division number N can be a non-integer as compared to the integer value presently being used. As such, the reference frequency can be increased, and, since the settling time is approximately inversely proportional to the reference frequency, this decreases the settling time of the system without the need to increase the channel spacing.

This change in circuitry is principally provided by the use of a programmable divider which allows for the use of a division number N which is a non-integer by dividing N/X, where X is an integer less than N, when the division number is even, and alternately between (N+1)/x and (N−1)/x in adjacent cycles of the reference frequency if the division number is odd. Complimentary circuitry is provided to accomplish this so that by the programming of the divider the desired output frequency may be accomplished without a change in channel spacing.

When the N program is odd, substantial sidebands at plus or minus the reference frequency and multiples thereof, around the VCO frequency may exist. To eliminate these interferring side bands an attenuator is provided to cancel the sample and hold output variations which result in the side band. An alternate means of removing the sidebands is to provide for an inverted output of an AND gate to be applied to a latch that is strobed by pulses. This results in a latch output that has a square wave in phase with the sawtooth wave of the reference frequency. Adding these two waveforms in a proper ratio, results in a waveform, which when sampled by the sample and hold output is DC thereby eliminating any interferring sidebands. If the amplitude of the square wave of the latch output is inversely proportional to N then perfect compensation for all values of N is achieved. This may be accomplished with a digital-to-analog conventor (D/A) inserted following the latch. If it is sufficient to have compensation just at the average value of N, then the D/A convertor can be dispensed with.

The invention also provides for the use of a dual modulus counter on the output of the VCO coupled with a modulus control counter and base counter to implement the aforementioned system. The modulus control counter is set to a programmed number which is decremented each time the dual modulus counter outputs a pulse. The dual modulus counter divides until the base counter reaches zero, which then outputs a pulse to the phase detector. This also resets the modulus control counter and base counter to the programmed number which can be either odd or even, starting another counting cycle. At certain values of N a modified program for alternate cycles is also provided for.

Accordingly, it is an object of the invention to provide for a high speed frequency synthesizer which minimizes the settling time of the system during a change in output frequency.

It is yet a further object to provide for the minimization of the settling time without the need to increase the channel spacing.

It is another object to provide for such a system while compensating for sidebands which arise around the VCO frequency causing timing and noise problems.

These and other objects are realized by the arrangements as described herein and as illustrated in the accompanying drawings.

DETAILED DESCRIPTION OF THE DRAWINGS

Figure 1:
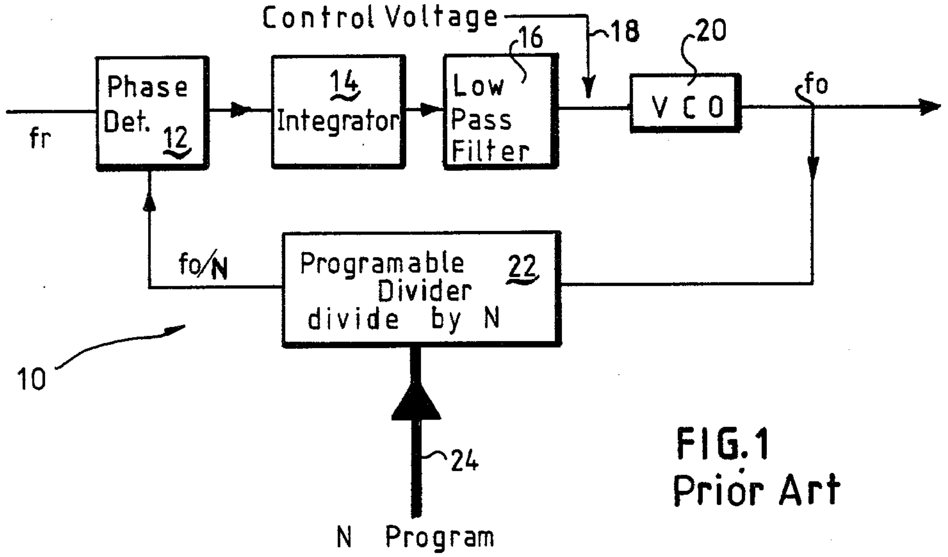
FIG. 1 is a block diagram of a prior art conventional Type II phase locked loop frequency synthesizer.

With regard now to FIG. 1, there is depicted in block diagram a prior art conventional Type II phase locked loop frequency synthesizer 10. The loop consists of a phase detector 12, which is usually a sample and hold device, that compares the phase of a reference signal (fr) introduced into the phase detector with that of an output signal (fo) introduced to the phase detector via a feedback loop. The output of the phase detector is then coupled through an integrator 14 and a low pass filter 16 whose output is then applied as a control voltage 18 to the input of a voltage controlled oscillator (VCO) 20. The control voltage 18 is derived by the phase comparison in the phase detector between the output signal frequency of the VCO, after suitable frequency division in programmable binary divider 22, and the reference frequency. Accordingly, the output of the oscillator is fed back through the programmable divider 22 into the phase detector 12.

The programmable divider 22 is programmed to divide or count by N, where N is a division number, according to the binary program 24 entered into it. Of course, alternate programming other than binary may be utilized as will become evident.

As aforementioned, in a frequency hopping system, the division number N is changed to suit a desired purpose with the end result that the oscillator 20 hops a frequency. The time between when N is changed and when the frequency settles often becomes important, however, in the usual programmable divider, N is an integer and settling time is only decreased at the expense of an increase in channel spacing.

Figure 2:
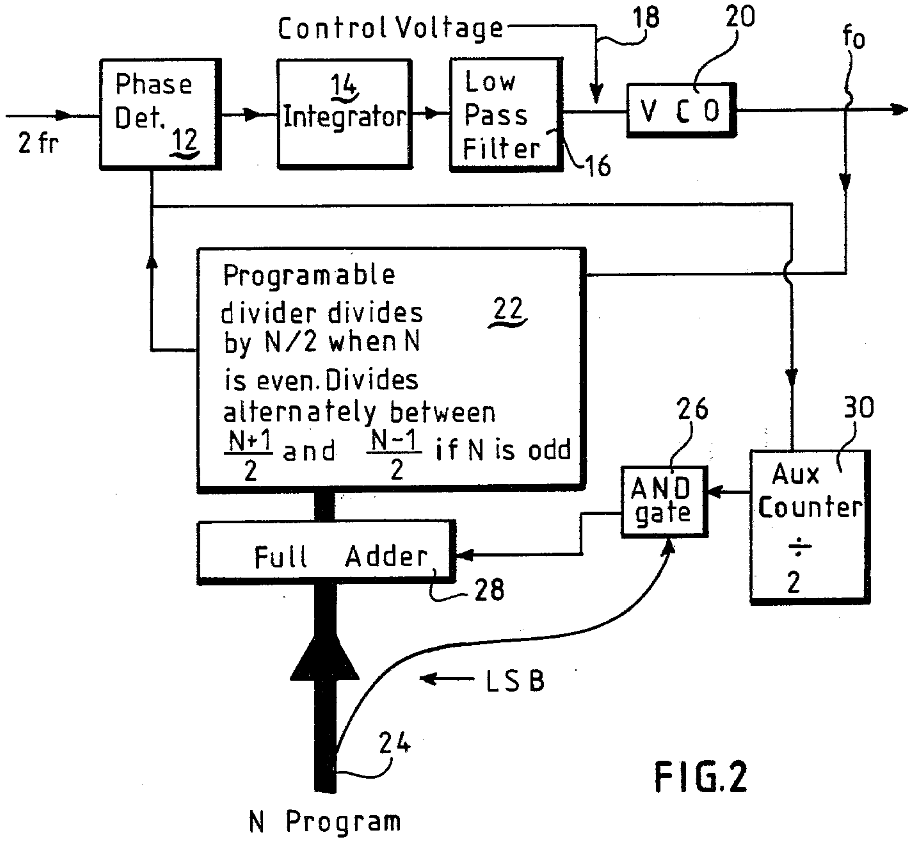
FIG. 2 is a block diagram of the enchanced speed Type II phase locked loop frequency synthesizer incorporating the teachings of the invention.

The present arrangement as shown in FIG. 2, provides for the utilization of circuitry so that the value of the division number M of divider 22 can be a non-integer whereby increasing the reference frequency (fr) and, thus, decreasing the settling time is accomplished without a need to increase the channel spacing. As shown, the reference frequency may be increased as desired and the manner of operation of this system is most easily seen by way of a numerical example. If we assume a reference frequency (fr) is 2 MHz, to obtain an output frequency (fo) of a 100 MHz, the programmable divider 22 must divide by M=50 which=N/2, therefor N=100. This is expressed in binary form as 1100100. The last digit constitutes the least significant bit (LSB) which may be applied to an AND gate 26. This AND gate 26 also receives input from the output of an auxiliary counter (divide by 2) 30 which receives an input by way of a feed back from the output of the programmable divider 22. The output of the AND gate 26 is then directed to a full adder 28 whose output is then directed to the programmable divider 22.

When the LSB is zero, the output of the AND gate is also zero, and the output of the full adder 28 is then equal to its input. In the present example, the input and the output of the full adder is 110010 in binary which is 50. Since the output of the adder is equal to 50, this is fed into the programmable divider which then is programmed to divide by 50, the desired value.

If N is changed to 101 or any other odd value to hop a frequency, the LSB becomes a 1, which then applies the output of the auxiliary counter (divided by 2) 30 to the full adder 28 via the AND gate 26. If the auxiliary counter (divide by 2) 30 output is zero, the programmable divider 22 will divide by 50 as aforementioned. As the programmable divider counts down, the auxiliary counter (divide by 2) 30 is then toggled and the programmable divider is now programmed to divide by 51. This then alternates the divider between 50 and 51 incurring an average division ratio of M=50.5 which=N/2. Thus, N=101 and the desired output frequency of 101 MHz is obtained.

However, it should be noted that the programmable divider is not restricted to N/2 and the denominator x can be any integer less than N as long as the radix of the auxillary counter and the address are properly chosen.

Often times in many applications of the systems illustrated unwanted sidebands will occur. This is due to the conditions which exist in practical equipment rather than an ideal system. As aforementioned, the phase detector is usually a sample and hold device. The signal sampled is a sawtooth wave, derived from the reference frequency (fr). The sample is taken each time the programmable divider terminates its count. It is usually retained in a capacitor until the next sample is taken. In the ideal system, after stabilization of the system, sample and hold output would be a low amplitude pure direct current without sidebands. However, in practice, the output will usually contain energy at the sampling frequency and its harmonic, due to feed through of the sampling pulse, droop due to leakage, finite sampling time, jitters, noise etc. As a result of this some of this energy passes through the low pass filter to the oscillator thereby resulting in discrete sidebands on the oscillator.

In the present arrangement shown in FIG. 2, when the N program is even, the programmable divider 22 divides by M=N/2 each cycle and all discrete oscillator sidebands would be due to sample and hold imperfections. These sidebands would be displaced from the oscillator frequency by ±fr and multiples thereof. Further, when the N program is odd, compensating waveforms result, as shown in Curves A-C of FIG. 3.

Figure 3:
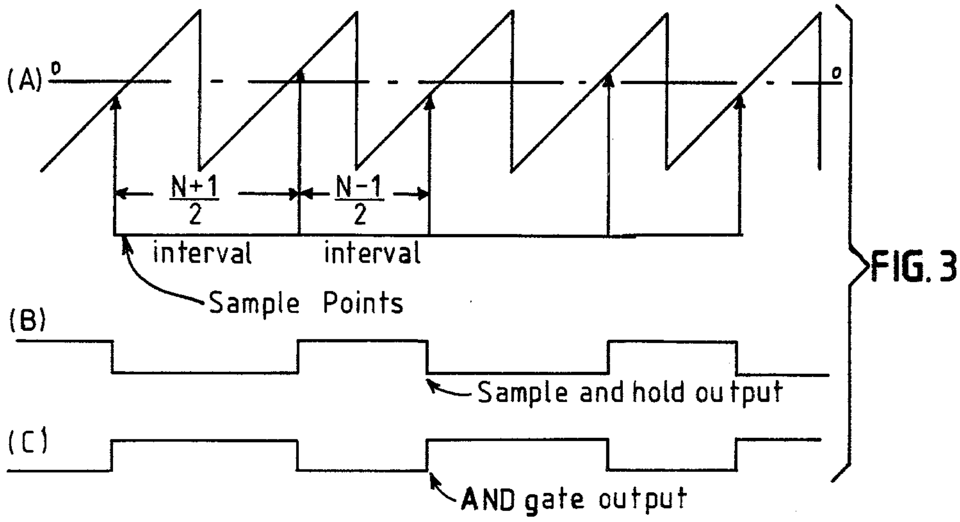
FIG. 3 depicts frequency waveforms at various points of the system shown in FIG. 2.

Again with reference to the previous example, the sawtooth wave frequency depicted in Curve A of FIG. 3 would be equal to the reference frequency (fr) of 2 MHz. The intervals between successive samples taken by the phase detector alternates because the program divider alternates betweeen 50 and 51. The sample and hold output provided by the phase detector is a rectangular waveform as shown in Curve B of FIG. 3, and its fundamental frequency is (fr) which could cause substantial sidebands at ±fr and multiples thereof around the oscillator frequency. However, the AND gate 26 output waveform, as shown in Curve C of FIG. 3, has exactly the same waveform as that of the sample and hold output except it is inverted. Therefore, the sample and hold output variation can be cancelled by summing the AND gate output and the phase detector output, which is accomplished by the summer 32 shown in FIG. 4.

Figure 4:
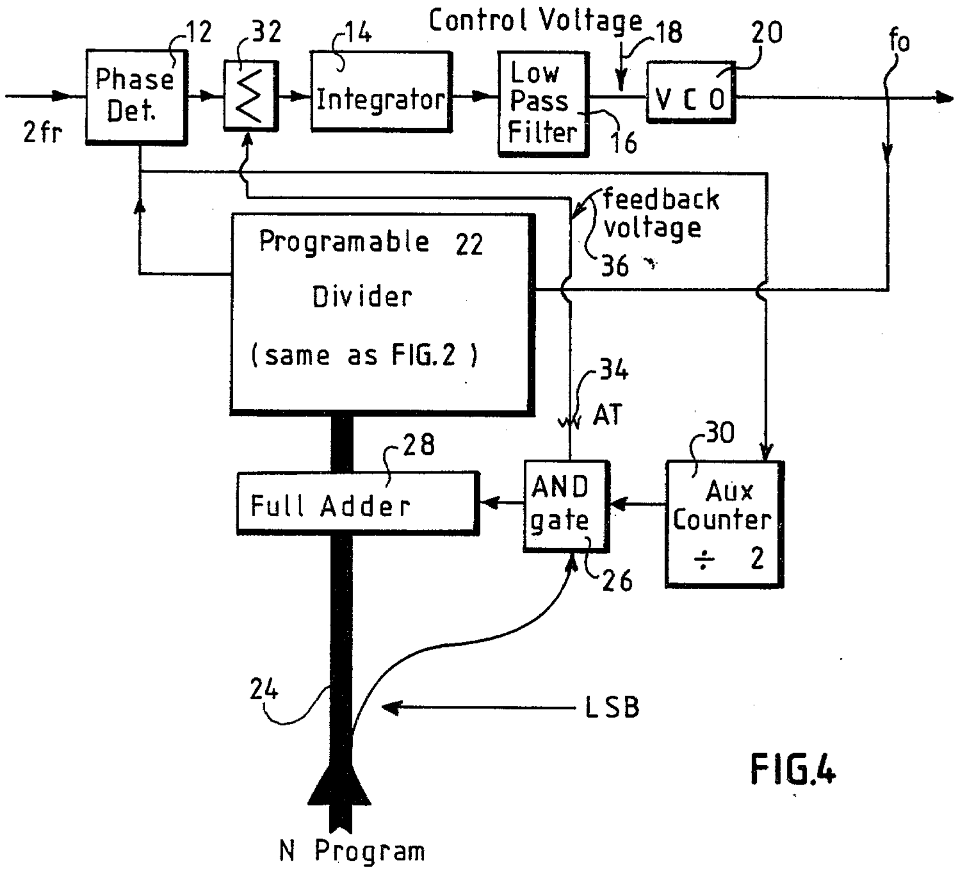
FIG. 4 is a block diagram of a system similar that shown in FIG. 2 with the phase detector output being compensated for interferring sidebands.

The operation of the system shown in FIG. 4 would be the same as that previously discussed with regard to FIG. 2 with the added circuitry to provide for cancellation of unwanted sidebands. Accordingly, like parts are similarly numbered.

In the simplest implementation to eliminate the sidebands, an attenuator 34 is provided and is adjusted so that perfect cancellation occurs when M average=(M minimum+M maximum)/2, where M minimum equals (N−1)/2 and M maximum equals (N+1)/2. For example, if M maximum/M minimum=1.2 then complete cancellation will occur for M average and a 90% cancellation would occur where M=M minimum, and M=M maximum. In addition, a further refinement for cancellation could be accomplished by making the feedback voltage 36 inversely proportional to the changing values of N which would then allow for perfect cancellation to occur for all values of N.

Figure 6:
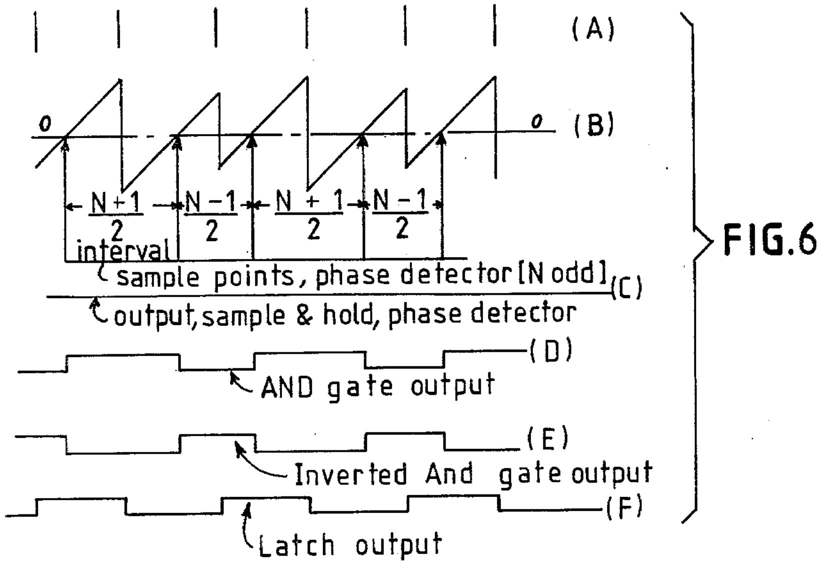
FIG. 6 depicts frequency waveforms at various points of the system shown in FIG. 5.
Figure 5:
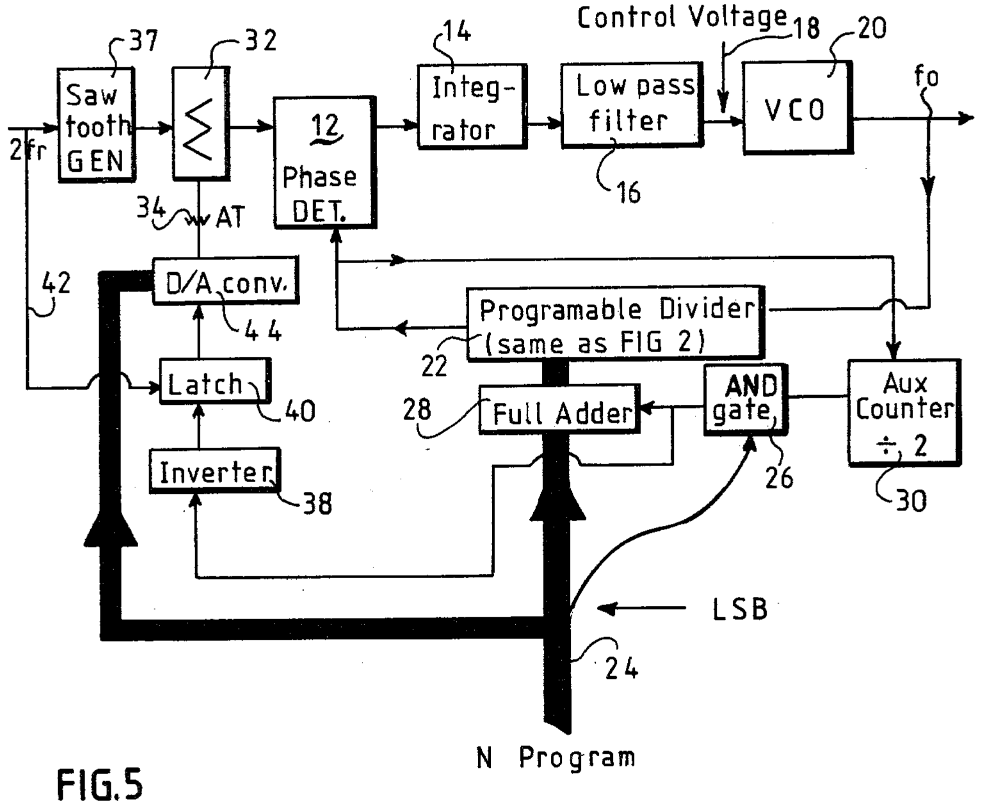
FIG. 5 is a block diagram of the enchanced speed Type II phase locked loop frequency synthesizer having a compensated sawtooth arrangement.

An alternate means of obtaining compensation in the system for the unwanted sidebands is represented by the block diagram shown in FIG. 5. The basic operation is the same of that as previously described with respect to FIGS. 2 and 4 except that the means for removing the sample and hold output variations that occur when N is odd is different. The waveforms involved in the block diagram shown in FIG. 5 are shown in Curves A–F of FIG. 6 as hereinafter discussed. A conventional sawtooth wave generator 37 is provided and generates a sawtooth wave from the pulse train whose frequency is 2 fr. The output of the AND gate 26 is applied to an inverter 38 which inverts the signal and applies this to a latch 40 that is strobed from pulses from the reference pulse train through an input 42. This reference pulse train is shown in Curve A of FIG. 6 with the AND gate output and the inverted gate output shown in Curves D and E of FIG. 6, respectively.

The latch 40 output is now a square wave in phase with the sawtooth wave generated by the sawtooth wave generator 37. This latch output waveform is shown in Curve F of FIG. 6. By adding these two waveforms, namely, the latch output and the output of the sawtooth wave generator, by means of the summer 32, in the proper ratio provided by the attenuator 34, there results the waveform shown in Curve B of FIG. 6. When such a waveform is sampled by the phase detector at the intervals of (N+1)/2 and (N−1)/2 in adjacent cycles of this waveform, when N is odd, the sample and hold output is a direct current as shown in Curve C of FIG. 6, which is comparable to an ideal situation. However, to obtain perfect compensation for all values of N, the amplitude of the square wave should be inversely proportional to N. This can readily be accomplished through the use of a digital-to-analog convertor (D/A) 44 interposed between the output of the latch and the attenuator 34. Of course, if compensation at N average is satisfactory, the D/A convertor is unnecessary. The particular arrangement shown in FIG. 5 also advantageously provides for compensation of sideband frequencies before the sample and hold function of the phase detector rather than after it. By doing so, this reduces the timing and noise problems which may exist if such compensation is effected after the sample and hold by the phase detector is accomplished.

Figure 7:
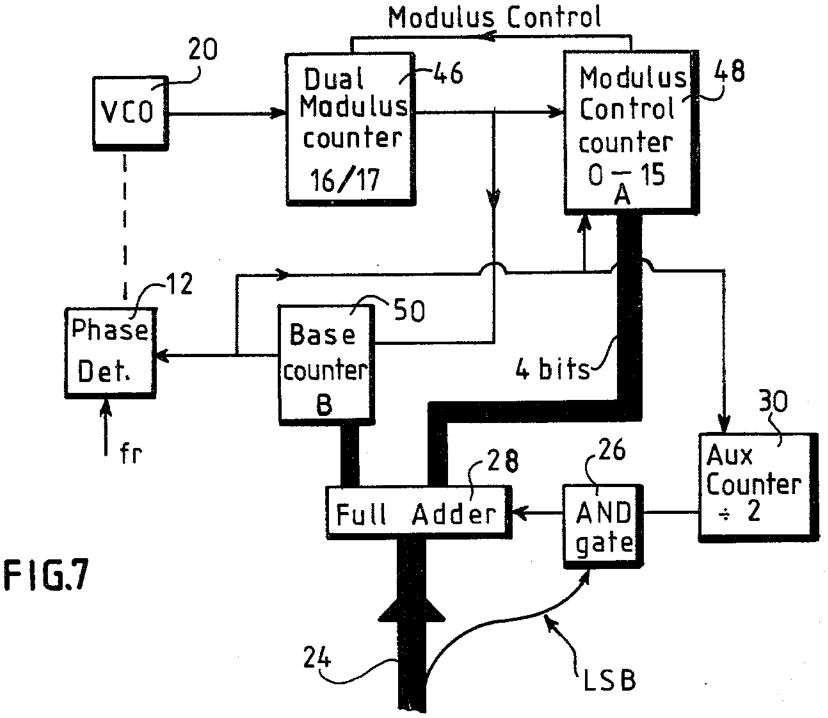
FIG. 7 is a block diagram of the enchanced speed Type II phase locked loop frequency synthesizer utilizing a dual modulus counter arrangement as a programmable divider.
Figure 8:
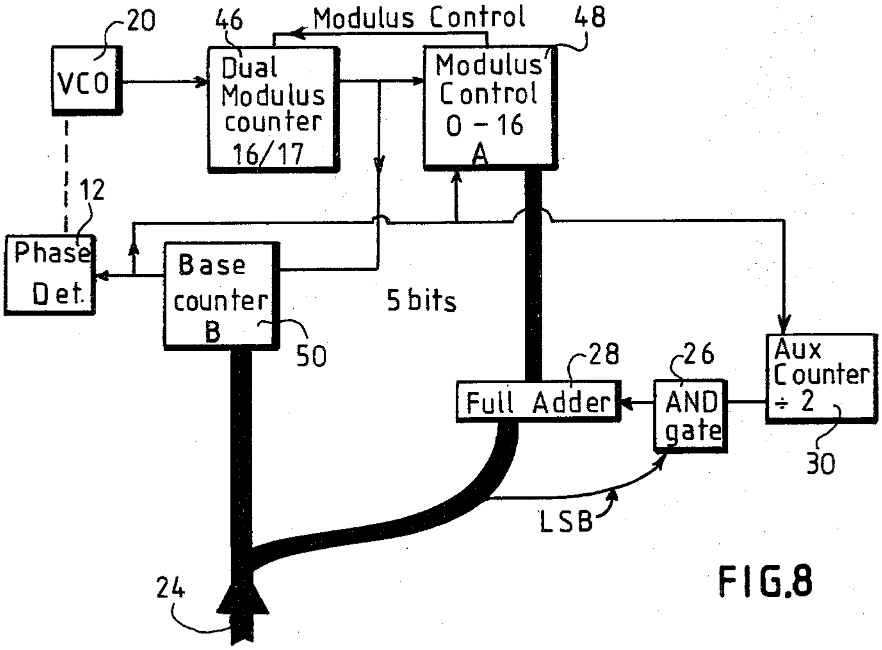
FIG. 8 is a block diagram of an arrangement similar to that shown in FIG. 7, however, providing for selected values of N.

Implementation of the aforementioned systems may be provided through the block diagram arrangement of programmable divider shown in FIGS. 7 and 8. Each utilizes a standard dual modulus counter 46 which receives the frequency output (fo) from the oscillator 20. With particular regard to FIG. 7, certain elements of the system are highlighted with the previously cited elements deemed included where appropriate in the system. The operation of this arrangement can best be described by way of an example in which assume the reference frequency fr to be 6 MHz and the frequency output to be 3 N.

At the start of the a counting cycle, a modulus control counter 48 is provided and is set to a program number. It is decremented each time the dual modulus counter outputs a pulse which is received at the modulus counter. This pulse is also sent to a base counter 50 and the dual modulus counter divides by 16 until the base counter reaches zero wherein it outputs a pulse to the phase detector 12. This pulse from the base counter also resets the modulus control counter 48 and the base counter to the program number which signifies the start of another counting cycle. Of course, rather than decrementing the program number the counters can start at zero and terminate when the program number is reached if so desired.

The following is a table which shows the relationship between the output frequency fo, the division number N, the program A for the modulus control counter 48 and the program B of the base counter 50;

TABLE A

| | N | A | B | B-A | B-A (16) | A (17) | ÷N Per-cycle | Ave ÷ # | f |
|---|---|---|---|---|---|---|---|---|---|
| Even | 480 | 0 | 15 | 15 | 240 | 0 | 240 | 240 | 1440 |
| | | 0 | 15 | 15 | 240 | 0 | 240 | | |
| Odd | 481 | 1 | 15 | 14 | 224 | 17 | 241 | 240½ | 1443 |
| Even | 482 | 1 | 15 | 14 | 224 | 17 | 241 | 241 | 1446 |
| | | 1 | 15 | 14 | 224 | 17 | 241 | | |
| Odd | 483 | 2 | 15 | 13 | 208 | 34 | 242 | 241½ | 1449 |
| ↓ | ↓ | ↓ | ↓ | ↓ | ↓ | ↓ | ↓ | ↓ | ↓ |
| | | 14 | 15 | 1 | 16 | 238 | 254 | | |
| Odd | 509 | 15 | 15 | 0 | 0 | 255 | 255 | 254½ | 1527 |
| Even | 510 | 15 | 15 | 0 | 0 | 255 | 255 | 255 | 1530 |
| | | 15 | 15 | 0 | 0 | 255 | 255 | | |
| *Odd | 511 | 0 | 16 | 16 | 256 | 0 | 256 | 255½ | 1533 |
| Even | 512 | 0 | 16 | 16 | 256 | 0 | 256 | 256 | 1536 |
| | | 0 | 16 | 16 | 256 | 0 | 256 | | |
| Odd | 513 | 1 | 16 | 15 | 240 | 17 | 257 | 256½ | 1539 |
| ↓ | ↓ | ↓ | ↓ | ↓ | ↓ | ↓ | ↓ | ↓ | ↓ |
| | | 15 | 16 | 1 | 16 | 255 | 271 | | |
| *Odd | 543 | 0 | 17 | 17 | 272 | 0 | 272 | 271½ | 1629 |
| ↓ | ↓ | ↓ | ↓ | ↓ | ↓ | ↓ | ↓ | ↓ | ↓ |
| Odd | 558 | 7 | 17 | 10 | 160 | 119 | 279 | 279 | 1664 |
| | | 7 | 17 | 10 | 160 | 119 | 279 | | |
| Even | 559 | 8 | 17 | 9 | 144 | 136 | 280 | 279½ | 1667 |
| ↓ | ↓ | ↓ | ↓ | ↓ | ↓ | ↓ | ↓ | ↓ | ↓ |

As will be noted, the first line of Table A represents the lowest number that can be programmed into the counters while maintaining continuous coverage during frequency hopping.

However, for certain values of N, as designated by an asterisk, the base counter 50 must have a different program for the alternate cycles of the system. This creates the need for the full adder which, as shown, has inputs from the AND gate 26. The N program which is a binary division number, having a minimum value of 240, with the output of a full adder having a four bit input into the modulus control counter 48 and an input into the base counter 50.

This need for the full adder may be eliminated by using the highlighted arrangement as show in FIG. 8. Selected samples of the programming of A for the modulus control counter 48 and B for the base counter 50 in accordance with varying values of N are shown in Table B.

TABLE B

| | N | A | B | B − A | B − A (16) | A (17) | =N Percycle | Ave ÷ # − N | | fo |
|---|---|---|---|---|---|---|---|---|---|---|
| Even | 512 | 0 | 16 | 16 | 256 | 0 | 256 | 256 | | 1536 |
| | | 0 | 16 | 16 | 256 | 0 | 256 | | | |
| Odd | 513 | 1 | 16 | 15 | 240 | 17 | 257 | 256 | ½ | 1539 |
| Even | 542 | 15 | 16 | 1 | 16 | 255 | 271 | 271 | | 1626 |
| | | 15 | 16 | 1 | 16 | 255 | 271 | | | |
| Odd | 543 | 16 | 15 | 0 | 0 | 272 | 272 | 271 | ½ | 1629 |
| Even | 544 | 0 | 17 | 17 | 272 | 0 | 272 | 272 | | 1632 |
| ↓ | ↓ | ↓ | ↓ | ↓ | ↓ | ↓ | ↓ | ↓ | | ↓ |

In this arrangement the binary division number is programmed into the base counter 50 and also into a full adder 28 which receives an input from the AND gate 26 while having a five bit output into the modulus control counter 48. As is evident, the basic difference between the two programming schemes becomes apparent when the division number N=511 wherein the modulus control counter 48 has a capacity of 16 for the arrangement shown in FIG. 8 as compared to 15 for the arrangement shown in FIG. 7. This count of 16 is used only for division number N having a value of 511, 543 and so on and since the program number for the base counter 50 must always be greater than or equal to the program number for the modulus control counter 48, the minimum value for the division number N=(2) (16) (16) which is=512 as compared to the minimum value of 240 for the arrangement provided by FIG. 7.

The programming schemes are used as examples and the arrangements disclosed herein should not be limited thereby. Further, although somewhat preferred embodiments in the present invention have been disclosed herein, it should be understood that the scope of the present invention should not be limited thereby, but rather the scope of the invention should be determined by that of the appended claims.

What is claimed is:

1. A phase locked loop type frequency synthesizer comprising:

a reference signal source;

a division factor program source providing a predetermined selected digital number N represented by a plurality of digital bits;

a voltage controlled oscillator (VCO) having an input and an output to provide an output signal for said synthesizer;

a phase detector having a first input coupled to said reference signal source, an output coupled to said input of said VCO and a second input;

a programmable divider having a first input coupled to said program source, a second input coupled to said output of said VCO and an output coupled to said second input of said phase detector, said divider being responsive to said predetermined number N for dividing said synthesizer output signal by a given division number M, where M is equal to N/x when said predetermined number N is even and is equal alternately to (N−1)/x and (N+1)/x when said predetermined number N is odd, where x is an integer less than said predetermined number N; and first means coupled to said output of said divider and said program source responsive to a given one of said plurality of bits of said predetermined number N to control said divider so that the average value of said given number M can be a non-integer.

2. A synthesizer according to claim 1, further including an integrator and a low pass filter in a series connection between said output of said phase detector and said input of said VCO.

3. A synthesizer according to claim 1, wherein said first means includes an auxiliary counter having an output and an input coupled to said output of said divider capable of dividing by x, and second means having a first input coupled to said output of said auxiliary counter, a second input coupled to said program source and an output coupled to a third input of said divider to inhibit an output signal from said auxiliary counter when said predetermined number N is an even number and to cause said divider to divide alternately between (N+1)/x and (N−1)/x when said predetermined number N is an odd number.

4. A synthesizer according to claim 3, wherein said second means includes an AND gate having a first input coupled to said output of said auxiliary counter, a second input coupled to said program source responsive to the least significant bit of said plurality of bits provided by said program source and an output coupled to said third input of said divider.

5. A synthesizer according to claim 3, further including third means coupled to said output of said second means and to said phase detector to compensate for undesired sidebands in said synthesizer output signal when said predetermined number N is an odd number.

6. A synthesizer according to claim 5, wherein said third means includes summing means coupled to said output of said phase detector and said output of said second means to cause a cancellation of said undesired sidebands.

7. A synthesizer according to claim 6, wherein said third means further includes:

an attentuator coupled between said summing means and said second means which is adjusted so that said undesired sidebands are cancelled when the average value of said given number M is equal to $$\frac{M \text{ minimum} + M \text{ maximum}}{2}$$

where M minimum equals (N−1)/2 and M maximum equals (N+1)/2.

8. A synthesizer according to claim 7, further including fourth means coupled between said second means and said attenuator to provide a waveform into said summing means from said second means which is inversely proportional to said given number M to provide cancellation of said undesired sidebands for all values of said given number M as it is varied.

9. A synthesizer according to claim 5, wherein said third means includes a pulse generator and a summer means in a series connection between said source of reference signal and said first input of said phase detector, and an inverter and latch in a series connection between said output of said second means and said summer means, said latch also being coupled to said reference signal source to provide an output signal therefrom which is added to the output signal of said pulse generator in said summer means whose output is utilized by said phase detector to provide a control voltage relatively free of said undesired sidebands.

10. A synthesizer according to claim 9, further including:

an attenuator coupled between said latch and said summer means adjusted so that cancellation of said undesired sidebands occurs when the average value of said given number M equals $$\frac{M \text{ minimum} + M \text{ maximum}}{2},$$

where M minimum equals (N−1)/2 and M maximum equals (N+1)/2.

11. A synthesizer according to claim 10, further including a digital-to-analog converter coupled between said latch and said attenuator and to said program source to compensate for all values of said given number M varied according to said predetermined number N by providing an output waveform having an amplitude inversely proportional to said given number M.

12. A synthesizer according to claim 1, further including second means coupled to said output of said first means and to said phase detector to compensate for undesired sidebands in said synthesizer output signal when said predetermined number N is an odd number.

13. A synthesizer according to claim 12, wherein said second means includes summing means coupled to said output of said phase detector and said output of said first means to cause a cancellation of said undesired sidebands.

14. A synthesizer according to claim 13, wherein said second means further includes:

an attentuator coupled between said summing means and said first means which is adjusted so that said undesired sidebands are cancelled when the average value of said given number M is equal to $$\frac{M \text{ minimum} + M \text{ maximum}}{2},$$

where M minimum equals (N−1)/2 and M maximum equals (N+1)/2.

15. A synthesizer according to claim 14, further including third means coupled between said first means and said attenuator to provide a waveform into said summing means from said first means which is inversely proportional to said given number M to provide cancellation of said undesired sidebands for all values of said given number M as it is varied.

16. A synthesizer according to claim 12, wherein said second means includes a pulse generator and a summer means in a series connection between said source of reference signal and said first input of said phase detector, and an inverter and latch in a series connection between said output of said first means and said summer means, said latch also being coupled to said reference signal source to provide an output signal therefrom which is added to the output signal of said pulse generator in said summer means whose output is utilized by said phase detector to provide a control voltage relatively free of said undesired sidebands.

17. A synthesizer according to claim 16, further including:

an attentuator coupled between said latch and said summer means adjusted so that cancellation of said undesired sidebands occurs when the average value of said given number M equals $$\frac{M \text{ minimum} + M \text{ maximum}}{2},$$

where M minimum equals (N−1)/2 and M maximum equals (N+1)/2.

18. A synthesizer according to claim 17, further including a digital-to-analog converter coupled between said latch and said attenuator and to said program source to compensate for all values of said given number M varied according to said predetermined number N by providing an output waveform having an amplitude inversely proportional to said given number M.

19. A synthesizer according to claim 1, wherein said divider includes a dual modulus counter having a first input coupled to said output of said VCO, a modulus control counter having a first input coupled to an output of said dual modulus counter, a second input coupled to said program source and an output coupled to a second input of said dual modulus counter, and a base counter having a first input coupled to said output of said dual modulus counter, a second input coupled to said program source and an output coupled to said phase detector and said first means.

* * * * *